United States Patent [19]

Miller

[11] Patent Number: 5,298,108
[45] Date of Patent: Mar. 29, 1994

[54] SERPENTINE SUPERLATTICE METHODS AND DEVICES

[75] Inventor: Mark S. Miller, Lund, Sweden

[73] Assignee: The University of California, Alameda, Calif.

[21] Appl. No.: 726,034

[22] Filed: Jul. 5, 1991

[51] Int. Cl.$^5$ .............................. C30B 25/14
[52] U.S. Cl. .................... 156/612; 156/610; 156/613; 156/614; 156/DIG. 72; 437/110; 437/129; 257/18
[58] Field of Search ............... 156/610, 611, 613, 614, 156/DIG. 72; 437/110, 129; 357/14, 16, 17; 257/15, 18

[56] References Cited

U.S. PATENT DOCUMENTS

| | | | |
|---|---|---|---|
| 3,309,553 | 3/1967 | Kroemer | 313/108 |
| 4,591,889 | 3/1986 | Gossard et al. | 357/4 |
| 5,013,683 | 5/1991 | Petroff et al. | 437/110 |
| 5,034,344 | 7/1991 | Jewell et al. | 437/129 |

OTHER PUBLICATIONS

M. S. Miller, et al., "Serpentine Superlattice: Concept and First Results"; paper delivered at International Conference on Semiconductor Physics, Thessaloniki, Greece, and the International MBE Conference, Aug. 1990.

Revised version of paper BA, submitted to the Journal of Crystal Growth 1990.

R. S. Geels, et al, "InGaAs Vertical-Cavity Surface-Emitting Lasers"; published in Journal of Quantum Electronics, Jun. 1991.

H. Weman, et al., "Optical Properties of AlGaAs/GaAs Quantum Well Wires Grown on GaAs Vicinal Substrates", preprint submitted for publication (date unknown).

C. Pryor, "Electronic Structure and Optical Properties of Serpentine Superlattice Quantum Wire Arrays", preprint submitted for publication (date unknown).

H. Weman, et al., "Photoluminescence Study of Quantum Wire Arrays in AlGaAs/GaAs Tilted Superlattice Structures", Abstract Submitted for Mar., 1991 Meeting of the American Physical Society (1991).

C. E. Pryor, et al., "Band Structure of the Serpentine Superlattice", Abstract Submitted for Mar. 1991 Meeting of the American Physical Society (1991).

M. S. Miller, et al., "Structure and Photoluminescence of AlGaAs Serpentine-Superlattice Quantum Wire Arrays", Abstract submitted for Mar., 1991 Meeting of the American Physical Society (1991).

M. S. Miller, et al., "Serpentine Superlattice: Concept and First Results"; Abstract Submitted for YABP Award, Student (date unknown).

Chalmers et al.; 6th International Conference on Molecular Beam Epitaxy, Aug. 1990.

"Band Gap Modulation in Two Dimensions by MBE ...", P. M. Petroff, et al. Journal of Crystal Growth 95 (1989) pp. 260-265, North-Holland, Amsterdam.

"Novel Approaches in 2 and 3 Dimensional ...", by P. M. Petroff, et al., Superlattices and Microstructures, vol. 8, No. 1, 1990.

Gaines et al, "Molecular-Beam Epitaxy Growth of Tilted GaAs/AlAs Superlattices by Deposition ...", J. Vac. Sci. Technol. B 6(4) 1988 pp. 1378-1381.

Petroff et al, "Novel Approaches in 2 and 3 Dimensional Confinement Structures: Processing and Properties", Superlattice Microstructures, 8(1), pp. 35-39, abstract only (date unknown).

*Primary Examiner*—Robert Kunemund
*Attorney, Agent, or Firm*—Albert C. Smith

[57] ABSTRACT

The disclosed invention provides a serpentine-shaped semiconductor superlattice for novel electric and electro-optic devices. The invention comprises a stepped, or vicinal substrate, having a plurality of layers deposited on the steps in succession. Each layer comprises at least two alternating materials. The extent to which each layer covers the exposed surface defines that layer's coverage ratio p. By varying the coverage ratios cyclically around p=1.0, the present invention creates undulating, or serpentine, connected paths of the materials. Each cycle of connected material may form a substantially parabolic path that grows widest at the extremum (or vertex) point of the parabola, where p=1.0. Charged carriers can be confined at these wide points, in quantum wires extending through the substrate parallel to the substrate steps. The resulting quantum mechanical structures allow reliable fabrication and operation of quantum wire lasers, waveguides and other electro-optical and electronic devices.

27 Claims, 5 Drawing Sheets

SERPENTINE SUPERLATTICE METHODS AND DEVICES

BACKGROUND OF THE INVENTION

This invention was made with Government support under Contract No. 88-0334 awarded by the Air Force. The Government has certain rights in this invention.

The present invention relates to the growing superlattice structures, and more particularly to methods for growing superlattices having a serpentine structure and devices incorporating serpentine superlattice components.

Methods for constructing superlattice structures and devices incorporating superlattice geometries have been previously disclosed. Gossard et al. in U.S. Pat. No. 4,591,889 disclose superlattice geometries and devices. Further refinements of methods for producing superlattice structures are disclosed by Petroff et al. in U.S. Pat. No. 4,591,889. The materials disclosed in the above-mentioned patent and patent application are hereby incorporated by reference.

Figure 1:
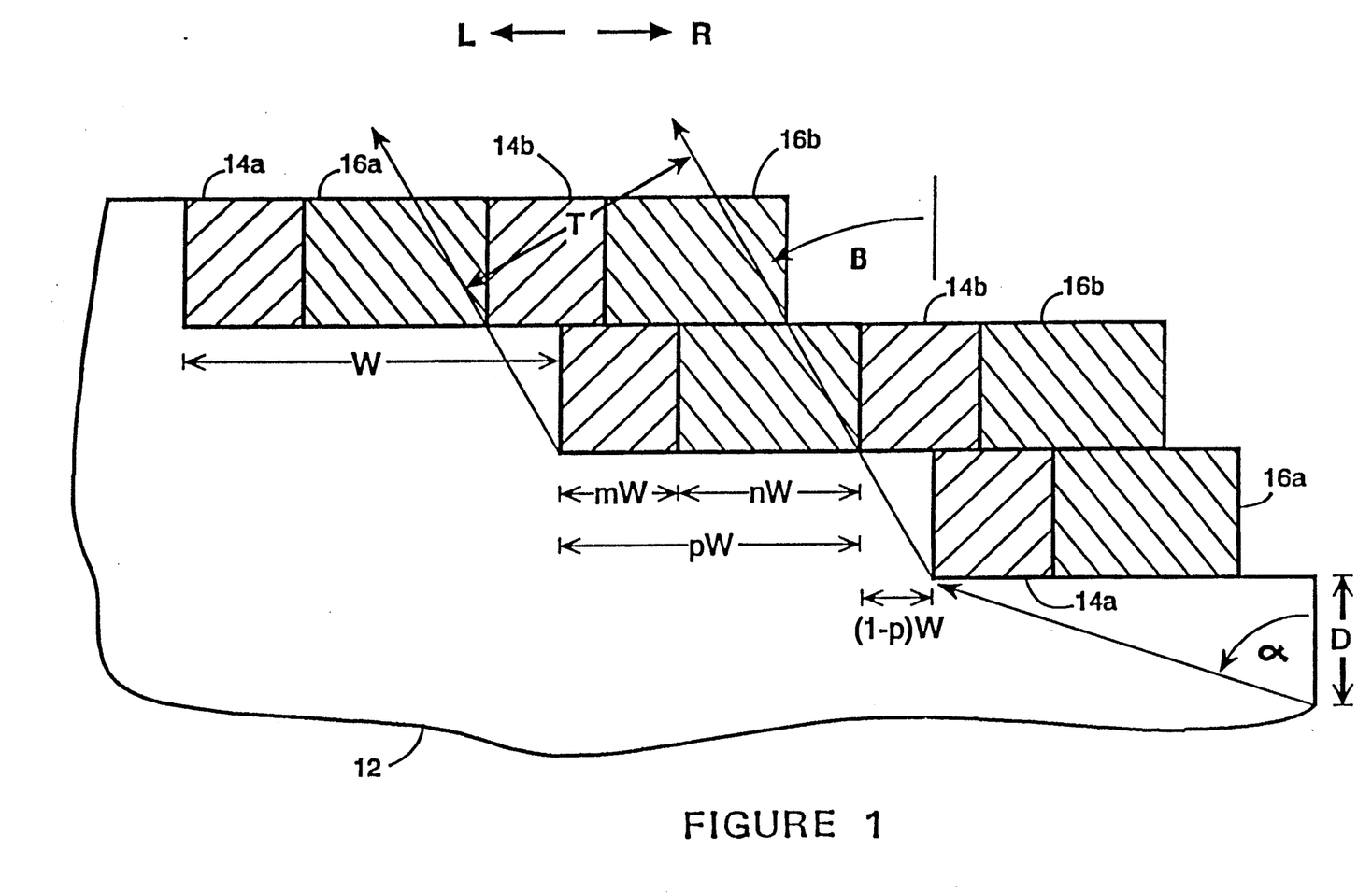
FIG. 1 shows a cut-away diagram of a conventional superlattice structure.

The central concept of superlattice structures, or more precisely tilted superlattices, is shown in FIG. 1. The process begins with a crystalline substrate 12 (or vicinal substrate) having a regular staircase array of monatomically high steps. The steps can be formed by carefully polishing a crystal at a slight angle from a crystallographic plane. Each deposition cycle for a layer of the superlattice begins by depositing a less-than-full monatomic layer of material on the crystal surface. The deposited atoms generally move around on the step surfaces and incorporate into the crystal lattice along the upward step edges. First material region 14a shows this formation. If, for example, a half-layer of material were deposited, the exposed edge of first material region 14a would form the new step edge. Each step edge thereby moves right one-half the width of each terrace step. The cycle completes by similarly depositing a partial layer of another material 16a such that the total amount of material incorporated is approximately one full layer. Moving laterally across the steps, the first layer comprises descending alternating stripes of two different materials. A second cycle places material regions 14b and 16b above the first regions. Depending on the coverage of each layer (relative to the width of each step), adjoining regions of similar materials in successive layers will tilt from vertical, allowing creation of devices with unique quantum mechanical electrical properties.

Analysis of superlattice structures by transmission electron microscopy has demonstrated the feasibility of growing tilted superlattice structures. However, two great difficulties in producing tilted superlattices also became apparent. First, respective material regions grow somewhat intermixed; molecules on the surface do not all segregate themselves properly to appropriate step edges, and the step edges themselves are not straight, but zig-zag across the surface. These problems may be alleviated by refining current crystal growth technologies, for example by improving the currently-grown gallium/aluminum arsenide (Ga,Al)As tilted superlattices, or by applying the tilted superlattice techniques to other material systems, such as the (Ga,Al)Sb system as discussed by S. A. Chalmers, et al. in the *6th International Conference on Molecular Beam Epitaxy*, August 1990. However, a second extremely difficult problem stems not from improper segregation, but from the geometry involved in cyclic growth techniques on vicinal substrates. As explained below, the tilt of the tilted superlattice is very difficult to control for promising superlattice geometries.

The angular tilt of the superlattice is defined and labeled as $\beta$ in FIG. 1. FIG. 1 also shows other relevant parameters for the growth of each layer. If the width of each substrate step is W, and m represents the percentage of a full layer (or coverage ratio) of the first material 14a deposited on the surface, then mW is the absolute width of the first material region. Likewise, if n represents the coverage ratio of the second material, then nW is the absolute width of the second material region 16a of that layer. Letting $p=m+n$ provides a value p for the overall coverage ratio of the two materials combined for the entire layer. Thereby, pW represents the absolute width of each step of a given layer. If p is less than 1, then some amount $(1-p)W$ of the step remains uncovered by the layer. Since the exposed edge of the second material region 16a forms the step edge for the next layer, the step edge can be seen to have moved left relative to the corresponding lower step edge of the first layer. If identical material regions are deposited for the second layer, adjacent regions in the first and second layers can be seen to have shifted as well (for example, region 14b shifts left above its comparable region 14a below it). The shift is measured by angle $\beta$. Since $\alpha$ is given by:

$$\tan \alpha = D/W \qquad (1)$$

and $$\tan \beta = (1-p)W/D, \text{ it follows that} \qquad (2)$$

$$\tan \beta = (1-p)/\tan \alpha \qquad (3)$$

Equation (3) describes how the coverage ratio p of each layer determines the local tilt $\beta$ of local layers, relative to the fixed tilt $\alpha$ of the terraced substrate 12.

Figure 2:
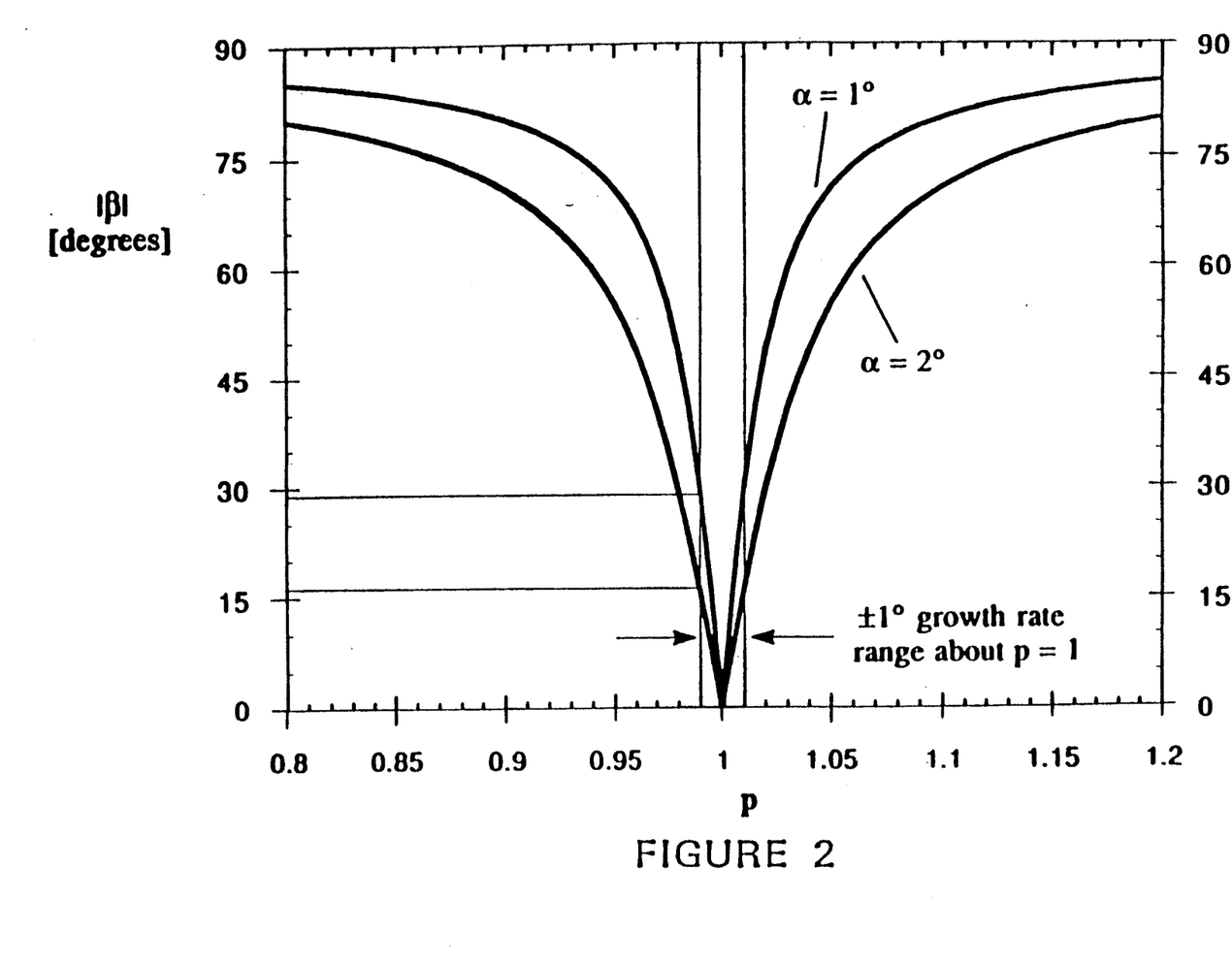
FIG. 2 is a chart illustrating the sensitivity of tile angle to coverage ratio.

The perpendicular period T, that is the perpendicular distance between repeating tilted adjoined regions (such as respective adjoined first material regions 14a, 14b etc.), is derived as follows:

$$T = W \cos \beta \qquad (4)$$

$$\cos \beta = 1/\sqrt{1 + \tan^2 \beta}, \text{ so} \qquad (5)$$

$$T = W[1 + (1-p)^2/\tan^2 \alpha]^{-\frac{1}{2}} \qquad (6)$$

and substituting from Equation (1) gives $$T = D[\tan^2 \alpha + (1-p)^2]^{\frac{1}{2}} \qquad (7)$$

where the perpendicular distance T between tilted superlattice regions depends upon the depth D of the substrate steps, the angle $\alpha$ of substrate tilt, and the coverage ratio p. FIG. 2 plots the relationship between the absolute value of tilt angle $\beta$ and the per-cycle coverage ratio p for two different vicinal GaAs substrates. The substrates are mis-oriented from the (100) crystal plane by 1° and 2°, which form a likely range of technologically interesting misorientation angles for (Ga,Al)As tilted superlattices. The graph reveals very sharp, narrow notches near $p=1.0$, that is near coverage ratios where the tilted superlattice is vertical. The most interesting superlattices are those with coverage ratios near 1.0, being vertical or only slightly tilted. Unfortunately, the steepness of the plot near p=1.0 means that small errors in coverage ratios lead to large errors in superlattice tilt. For example, a 1% error in the coverage ratio on a 1° mis-oriented GaAs substrate creates a tilt error of over 30° from an intended vertical structure. Such large variances in tilt produce disastrous consequences for accurate control of the electrical and optical properties of superlattice devices. The extreme sensitivity of the tile makes specific electron confinement energies very difficult to achieve at given points on the substrate, and makes the realization of uniform confinement energies across the substrate virtually impossible.

Vertical superlattices cannot be reliably manufactured presently because of technological difficulties in depositing exactly one full monolayer of material each cycle. A 1% accuracy in deposition and incorporation represents perhaps the best achievable and repeatable result given current technology. Yet the 1% figure is a best-case value for a specified growth-rate at only one particular point on a wafer. Economically viable superlattice fabrication depends upon guaranteeing design parameter uniformity across an entire wafer. State-of-the-art equipment designed to produce uniform layers across a susbstrate typically can only guarantee a 2% variation. As indicated in FIG. 2, even this small variation can be enough, by inducing wide tilt variations, to hinder the development of useable, reliable superlattice devices.

What is needed is an improved method and apparatus for fabricating superlattice structures. An improved superlattice structure should provide for repeatable manufacturing of uniform superlattice devices. The improved superlattice methods and structures should avoid the difficulties induced by variations in tilt from layer to layer. The method and structure should provide readily manufacturable superlattices with current deposition equipment and allow the fabrication of sophisticated superlattice electric and electro-optic devices.

SUMMARY OF THE INVENTION

In accordance with the present invention, a serpentine superlattice structure comprises a substrate having a surface, and a plurality of substantially horizontal and contiguous layers above the substrate surface. Each of the layers is composed of alternating first and second material regions, such that one of the material regions can serve as a reference point for locating a particular lattice layer along the substrate surface. For some contiguous subset of ascending layers, a first material region of each successive layer will substantially overlap a corresponding first material region of the layer below, but be shifted by some amount either left or right. One layer of the contiguous subset of layers occurs at a minimum of zero average shift with respect to the adjoining layers and layers above this extremum layer shift monotonically in one direction while the layers below this extremum layer shift monotonically in the opposite direction such that the contiguous subset of layers form a serpentine superlattice in which the curvature is at a maximum at this extremum layer in accordance with the present invention. Monotonic shifts refer to successive layer shifts of zero or greater in only one direction.

The present invention creates the particular back-and-forth shifting of the serpentine superlattice by purposefully changing the successive coverage ratio p for each layer. Since p=1.0 theoretically creates vertical superlattices, periodically changing p from less than 1 to greater than 1 and vice versa creates undulating overlapping material regions that move back and forth across a vertical axis. Serpentine superlattices may have arbitrary shapes near where p=1. This shape depends on the particular functional form of the per-cycle coverage change near this extremum. Of course, one of the most useful serpentine superlattices is obtained when the per-cycle coverage is changed linearly as the value p=1 is passed through. This corresponds to the situation of FIG. 5a, where p changes as a linear function of time. A linear ramping results in a serpentine superlattice structure that comprises exactly parabolic arcs. If, instead, p changes as some other, arbitrary function of time, then a different shape is obtained. Given proper choices for materials (semiconductors such as GaAs and (Ga,Al)As), the first material regions can form potential wells for electrons or holes within the superlattice device. Electrons will be confined at the widened regions where the parabolic regions turn a corner (at the inflection point layers); where the parabolic regions narrow and pinch, away from the inflection point, electrons will experience regions of higher potential energy. Serpentine superlattices can form one-dimensional quantum wells, or quantum wires, useful for a variety of purposes. Quantum wires formed in electro-optic material can serve as waveguides; pumped with energy, the wires can form semiconductor lasers. Quantum wires can also find use as low-loss channel regions in transistor circuits, and in such other applications as solid-state lasers of double heterostructure or surface-emitting configurations, light-emitting diodes, light modulators and detectors, and transistors. Quantum wire are useful in optoelectronic devices. The desirable devices arise from the increased efficiency with which the energy of an electrical current may be converted to light, and vice versa, as well as from the polarization of the light, which is determined by the quantum mechanical properties of the quantum wire. For example, conventional double heterostructure, solid state semiconductor lasers may be improved by substituting quantum wires for the optically active region, thereby increasing the efficiency of the device. A new class of surface-emitting semiconductor laser would also benefit from the increased efficiency of a quantum wire and, further, from the polarization properties of the light from the wires. In particular, the emitted light is preferentially polarized along the wire, thus allowing a further increase in efficiency by selecting a preferred polarization for the lasing mode. In addition to emitting light from a semiconductor laser, or even a light emitting diode (LED), optoelectronic devices are desired which modulate a light signal by turning the signal on or off or by changing the signal's polarization Also, devices are desired which can detect a light signal and convert it into another light signal or into an electrical signal. Quantum wires improve the efficiency of a modulator or detector via the more efficient interaction between light and electrons. Importantly, the polarization properties of quantum wire arrays, such as the serpentine superlattice, allow modulators and detectors that operate on the polarization of a light signal to be fabricated.

In addition to optoelectronic applications, quantum wires are also useful for electronic devices. These applications arise from the nature of electrical current flow through quantum mechanically one-dimensional systems such as quantum wires. The resistance to current flow may be reduced, and the rate of this current flow may be increased, along a quantum wire. Thus, an electrical signal may be switched or amplified at a higher frequency in a quantum wire. Also, the current flow perpendicularly across an array of semiconductor quantum wires could display efficient, high frequency transistor action by being controlled with an appropriate voltage on a nearby control electrode.

The present invention avoids many of the difficulties of ordinary tilted superlattice structures Present superlattice techniques depend upon precise knowledge and control of the per-layer coverage ratio p. The present invention, when a parabolic cross section is desired, instead relies upon ramping the coverage ratio through a series of values. The ramping rate determines the shape and thereby the electron confinement energies of the parabolic serpentine superlattice structures. The ramping rate is a well-controlled parameter, even though the actual per-layer coverage ratio is not. By employing the sensitivity to the coverage ratio, rather than fighting against it, the present invention can produce much more reliable and manufacturable superlattice devices than previous methods.

The invention, using a novel ramping deposition of superlattice layers, achieves a unique serpentine structure. The invention can be applied to a variety of semiconductor applications to allow fabrication of high-tolerance electronic devices. The devices formed by the methods and apparatus of the present invention allow accurate control over electronic confinement energies and avoid dependence upon precise control over parameters. These and other features and advantages or the present invention are apparent from the description below with reference to the following drawings.

DESCRIPTION OF THE PREFERRED EMBODIMENTS

Figure 3:
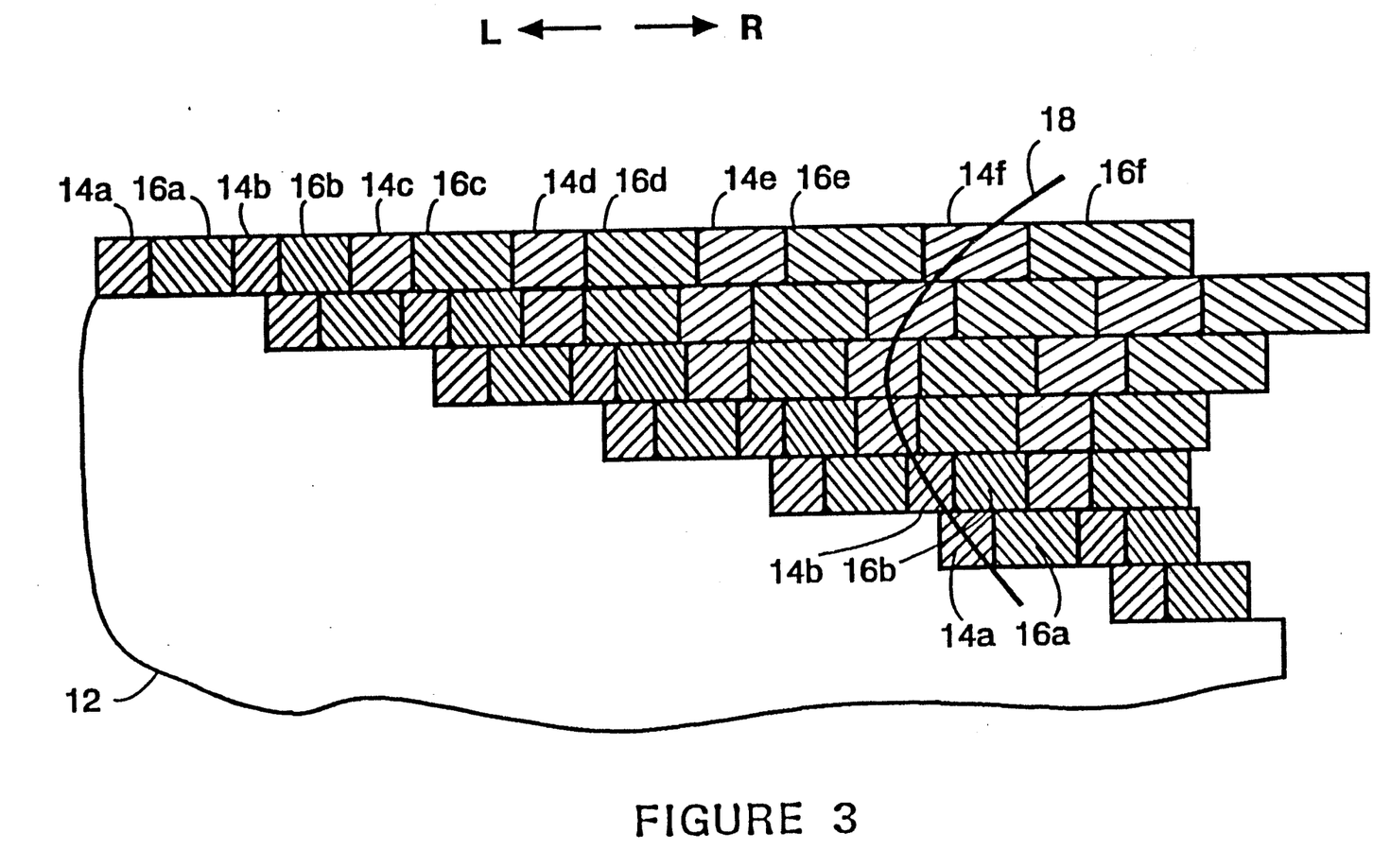
FIG. 3 is a cut-away diagram of a serpentine superlattice structure in accordance with the present invention.
Figure 4:
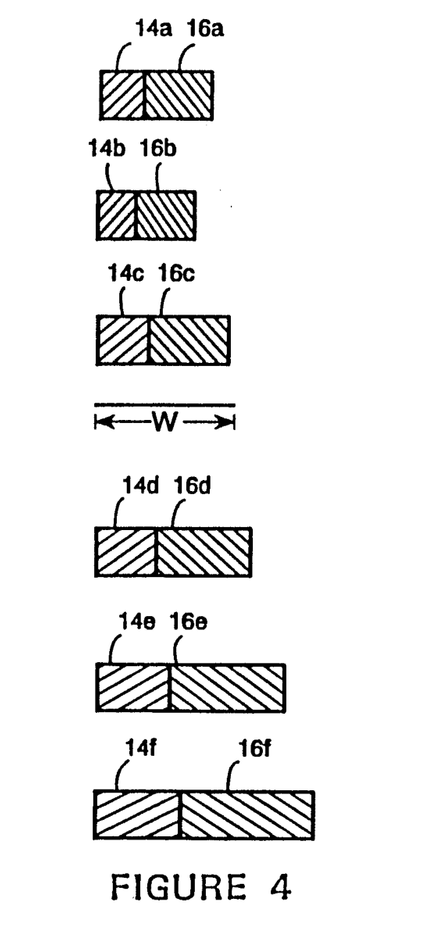
FIG. 4 shows a set of first and second material regions from successive superlattice layers, revealing differences in coverage ratios relative to substrate step width.

In accordance with the present invention, FIG. 3 shows a serpentine superlattice structure in accordance with the present invention. In similar manner, as shown above in FIG. 1, the invention begins with a stepped substrate 12. Successive layers of a first material 14 and a second material 16 are deposited on each step. In FIG. 3, the first layer comprises material regions 14a and 16a, formed on each step of substrate 12. One can look across the topmost surface of the layers to see each layer in succession. In FIG. 3, the second layer comprises material regions 14b and 16b, the third layer comprises material regions 14c and 16c, and so on. The relative size of each layer can be seen in FIG. 4, where sets (or combined regions 14,16) of first and second material regions 14 and 16 for each layer have been stacked above one another. A measurement of the width W of the steps of the substrate 12 in FIG. 3 is also shown. For combined regions of a layer having a length equal to W, the coverage ration p for the layer equals 1.0. Thus, one sees that the combined regions 14,16 increase from a p<1.0 to a p>1.0 with each successive layer.

Varying the coverage ration p for each layer linearly changes that layer's relative placement. If one follows a connected series of a given material region, using, for example, the region's midpoint as a reference point, the variations in layers trace out a parabolic arc. One example is shown by the parabolic line 18 in FIG. 3, traced through adjoined, stacked first material regions 14. In this example, the fourth deposited layer given by combined region 14d,16d provides the inflection point layer where the parabolic-shaped superlattice structure 18 changes tilt direction. If several back-and-forth depositions occur, the connected regions form an undulating "serpentine" path through the deposition layer. If the first material regions 14 are semiconductor regions of lower electron affinity, electrons can be confined to the serpentine paths of connected first material regions, such as the path indicated by line 18. The changes in coverage ratios for the deposition layers indicated in FIG. 3 are somewhat disjoint to demonstrate the invention: in actual practice, each layer's coverage ratio would vary only slightly from the previous layer, allowing much finer graduations in shift and much smoother parabolic paths of connected material.

The serpentine superlattice structures of the present invention can be prepared on single-crystal vicinal substrates with a variety of depositions methods. Molecular beam epitaxy (MBE), metal-organic chemical vapor deposition (MOCVD) or other equivalent processes can be employed to grow the successive layers. Previous references on superlattice methods describe the use of Group III-V semiconductor materials in superlattice structures. The preferred embodiment of the present invention uses material in the gallium arsenide (GaAs) and gallium aluminum arsenide ((Ga,Al)As) families. That is, the substrate 12 is formed from substantially pure GaAs. The first material regions 14 (which form the active regions of the semiconductor superlattice) are also formed from substantially pure GaAs, while the second material regions (which form the barrier walls to electron movement), are formed from a mixture of GaAs and AlAs, or $Al_xGa_{1-x}As$, where $0<x<1$. While the embodiment is discussed in relation to these materials, it should be obvious to those skilled in the art that many other materials including Group II elements and Group II-VI compound semiconductors can also be used.

In MBE growth of III-V superlattice structures, the per-layer coverage ratio p depends upon the number of column-III atoms that arrive at the growing surface, because under normal growth conditions all of these atoms will stick and incorporate. As discussed in the prior references, MBE takes a source of deposition material heated in an ultra-high vacuum chamber and forms a beam of column-III molecule species to direct towards the vicinal substrate. The partial cycle can be started and stopped by rapidly unblocking and then blocking the beam with a shutter. By changing the shutter time or the material temperature, the amount of atoms reaching the substrate, and therefore the coverage ratio, can be controlled. Changing the shutter times has proven far more practical in the practice of the present invention.

MOCVD techniques can also be employed to create high-quality serpentine structures. In MOCVD deposition, the arrival rate of column-III constituents is governed by the flow of the metal-organic gasses. Cyclically changing the timing of gas flows during layer growth changes the per-layer coverage ratio to create a serpentine superlattice.

For both the MBE and MOCVD techniques, other parameters can also be used to control the per-layer coverage ratio. For many molecular species, the sticking coefficient (the fraction of the species that adheres and does not re-evaporate during growth) depends on the substrate temperature. thereby, the source temperature, gas flows or shutter times can be held constant while changing only the substrate temperature during growth to properly very the per-layer coverage ratio. Sticking coefficients can also be affected by the wavelengths of light striking the surface. Therefore, changing the ambient light can provide a further method for varying the composition of each layer.

Figure 5A:
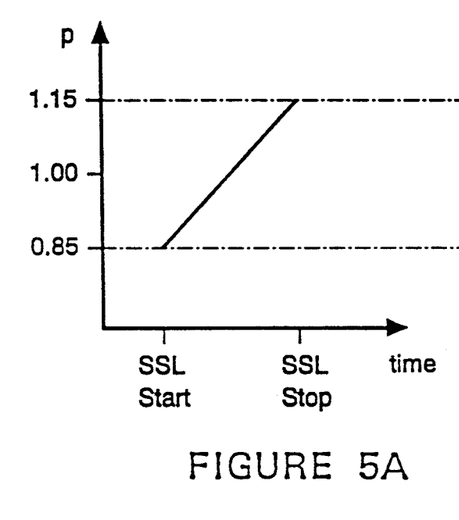
FIGS. 5A and 5B are charts showing a ramping of coverage ratio p and the corresponding change in tilt angle $\beta$.
Figure 5B:
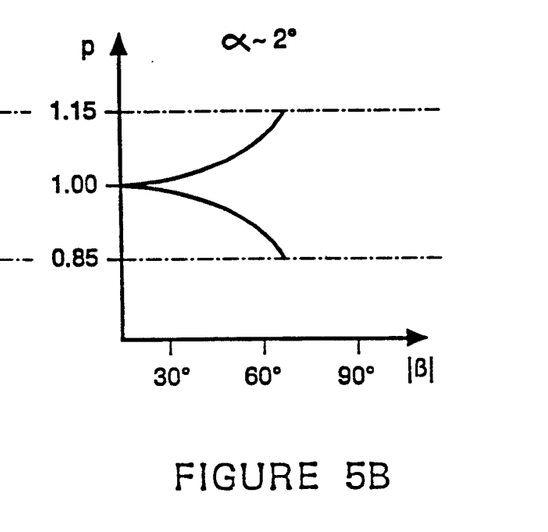
Figure 5C:
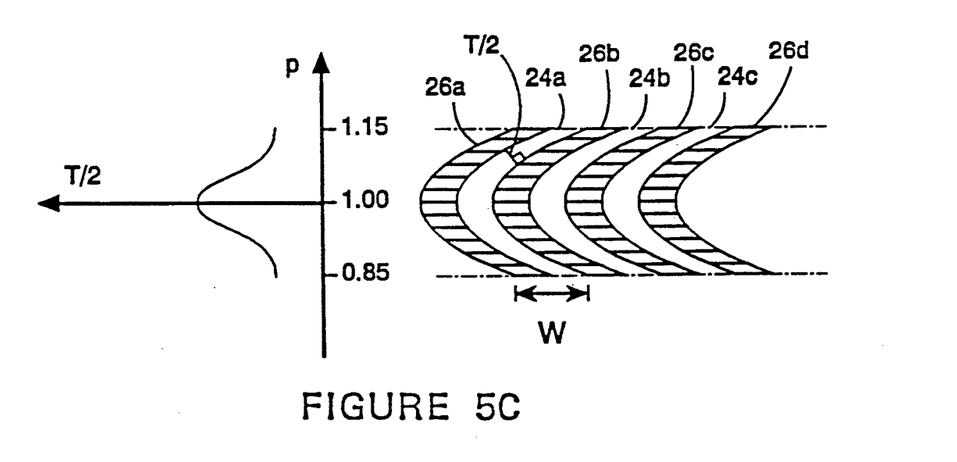
FIG. 5C is a chart showing the resulting parabolic-shaped serpentine superlattice structures and the dependence of T, the width between successive superlattices, on the coverage ratio p, for the parameters shown in FIGS. 5A and 5B.

The relationships between a changing coverage ratio p and the tilt angle $\beta$ are shown in FIGS. 5A and 5B. FIG. 5A shows a typical linear ramping cycle for the coverage ratio p from p=0.85 to p=1.15 with an arbitrary starting and stopping time. For a typical vicinal substrate mis-orientation angle $\alpha=2°$, FIG. 5B shows the corresponding change in the absolute value of the tilt angle $\beta$. As given by Equation (3), the tilt angle is zero when p=1.0, and is a positive angle for p<1.0 and a negative angle for p>1.0. The resulting serpentine structures are shown in FIG. 5C, composed of a periodic array of parabolic arcs defining the well and barrier interfaces. For example, serpentine structures 24a,b,c can each represent a collection of adjoined first material regions 14 (the wells), while serpentine structures 26a,b,c,d can each represent a corresponding collection of adjoined second material region 16 (the barriers). The perpendicular distance T/2 between parabolic serpentine barriers 26 is also plotted in FIG. 5C. T/2 increases as p tends toward 1.0, indicating that the widest points in the serpentine wells 24 and barriers 26 are found at vertices of the parabolas.

The relatively small portion of the growth cycle where T/2 becomes wide allows localized confinement of electrons. The electron confinement energies of the serpentine superlattices are determined by the curvature of the parabolas near their extremum points. The curvature in turn depends on the ramping rate of the coverage ratio p. The ramping rate is a well-controlled parameter, even though the nominal coverage ratio is not. That is, if there is a residual systematic offset error in the coverage ratio, the well and barrier parabolas merely shift up or down in the growth direction, but their shape does not change. Since the shape is insensitive to absolute error in coverage ratio, particular confinement energies can be guaranteed, given a wide-enough coverage ratio spanning range. Furthermore, given a sufficient spanning of coverage ratios, the confinement energies will be uniform across the substrate, despite small changes in the actual value of local coverages.

Figure 6:
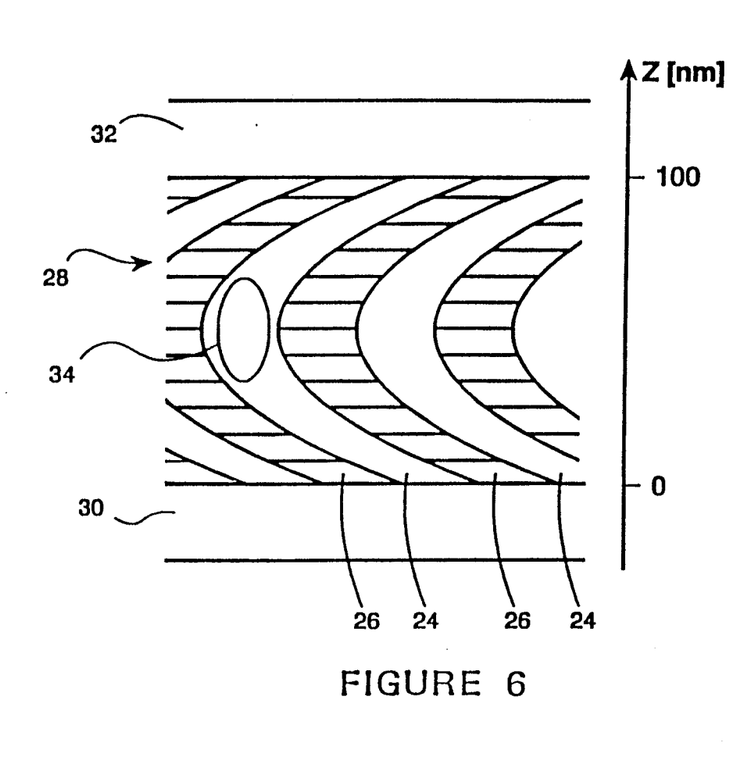
FIG. 6 shows a cross-section of a device using a serpentine superlattice.

FIG. 6 illustrates one device 28 incorporating a serpentine superlattice. A series of serpentine barriers 26 and wells 24 have been sandwiched between two cladding layers 30 and 32 formed from AlGaAs. A typical device might measure 100 nm in height. Region 34 within the widest portion of each serpentine well 24 confines electrons, as discussed above. Since FIG. 6 represents a two-dimensional vertical slice through the substrate, region 34 comprises a wire extending perpendicular to the cross-section of FIG. 6. The quantum wire created by region 34, bound between opposing serpentine barrier regions 26 and the pinched ends of serpentine well region 24, can be employed for a variety of uses. For example, the sandwiched regions can be employed as the optically active region in a semiconductor laser.

While the present invention has been described with reference to preferred embodiments, those skilled in the art will recognize that various modifications may be provided. Any number of parabolic arcs of continuous material can be created in the growth direction, creating complex serpentine patterns. The coverage ratio ramping rate can be varied for successive subsets of contiguous layers, creating different confinement energies at different depths in the material Different semiconductor materials in addition to III-V semiconductor systems may be used, including (Al, Ga) As systems and Group IV (Si, Ge) systems, and Group II-VI (Hg, Cd) Te systems may also be used. Also, metal-metal and metal-semiconductor systems are also useful in accordance with the present invention. And, more than just two materials may be deposited and incorporated during each cycle to produce a wide variety of structures. The methods of the present invention, by accommodating geometric sensitivities to process parameters, can find other applications as well. The methods of the present invention can prepare small-dimensional heterostructures on substrates other than the vicinal, stepped substrates of the preferred embodiment. For example, various polymer, grapho-epitaxy, metal-metal, and metal-semiconductor structures can be built by altering layer coverage ratios in accordance with the present invention. Also, substrates which are not flat with uniform steps, but rather which have, on average, a rolling, curved surface may be used to provide molecule-high steps of spatially-varying width. These and other variations and modifications regarding the described embodiments are provided for by the present invention, the scope of which is limited only by the following claims.

I claim:

1. A device comprising:

a substrate, said substrate having a surface, said surface having a left and right direction horizontally across said surface;

a plurality of substantially horizontal layers disposed above said surface of said substrate, each of said layers having a plurality of first material regions, each of said layers having a plurality of second material regions, each of said layers having a reference point defined by one of said first material regions, said layers being disposed above said substrate such that for a contiguous plurality of said layers above and below an extremum point layer, said reference points of a lower set of said layers of said contiguous plurality of layers below said extremum point layer are monotonically shifted in a first direction, the amount of change of the shift varying with each successive layer of said lower set, while said reference points of an upper set of said layers of said contiguous plurality of layers above said extremum point layer are monotonically shifted in a second direction different from said first direction, the amount of change of the shift varying with each successive layer of said upper set.

2. The device as recited in claim 1 wherein for said contiguous plurality of layers, said first direction is left and said second direction is right.

3. The device as recited in claim 1 wherein for said contiguous plurality of layers, said first direction is right and said second direction is left.

4. The device as recited in claim 1 wherein said contiguous plurality of layers form a serpentine superlattice.

5. The as recited in claim 1 wherein said substrate surface comprises a plurality of steps.

6. The device as recited in claim 5 wherein said substrate and said first and second material regions comprise semiconductors.

7. The device as recited in claim 6 wherein said semiconductors include Group III-V compound semiconductors.

8. The device as recited in claim 7 wherein said substrate substantially comprises gallium arsenide.

9. The device as recited in claim 7 wherein said first material regions substantially comprise gallium arsenide.

10. The device as recited in claim 7 wherein said second material regions substantially comprise gallium aluminum arsenide.

11. The device as recited in claim 6 wherein said semiconductors include Group II elements.

12. The device as recited in claim 6 wherein said semiconductors include Group II-VI compound semiconductors.

13. A device comprising:
  a substrate having a surface, said surface having a plurality of steps, each of said steps having substantially the same height and width;
  a first layer lying on said surface, said first layer having a plurality of first material regions, said plurality of first material regions having a coverage ratio of $m_1$, each of said first material regions located similarly to a respective step of said surface, said first layer having a plurality of second material regions, said plurality of second material regions having a coverage ratio of $n_1$, each of said second material regions located similarly to a respective step surface and located adjacent to a respective first material region, said first layer having a first layer coverage ratio of $p_1 = m_1 + n_1$; and
  a plurality of ith layers lying above said first layer, each of said ith layers located such that an ith layer is below an (i+1)th layer and above an (i−1)th layer, each of said ith layers having a plurality of first material regions, said plurality of first material regions for said ith layer having a coverage ratio of $m_i$, each of said first material regions for said ith sheet located similarly to a respective step of said surface, each of said ith layers having a plurality of second material regions, said plurality of second material regions for said ith sheet having a coverage ratio of $n_i$, each of said second material regions for said ith sheet located similarly to a respective step surface and located adjacent to a respective first material region, each of said ith layers having an ith layer coverage ratio of $p_i = m_i + n_i$, said layer coverage ratio varying with the index of i of each layer such that for a first set of a plural number of contiguous layers, said first set of contiguous layers having either all coverage ratios $p_i$ less than 1.0 or all coverage ratios $p_i$ greater than 1.0, said layer coverage ratio $p_i$ monotonically changes with i.

14. The device as recited in claim 13 wherein said substrate and said first and second material regions comprise semiconductors.

15. The device as recited in claim 14 wherein said semiconductors are Group III-V semiconductors.

16. The device as recited in claim 15 wherein said substrate substantially comprises gallium arsenide.

17. The device as recited in claim 15 wherein said first material region substantially comprises gallium arsenide.

18. The device as recited in claim 15 wherein said second material region substantially comprises gallium aluminum arsenide.

19. The device recited in claim 14 wherein said semiconductors include Group II elements.

20. The device as recited in claim 19 wherein said semiconductors include Group II-VI compound semiconductors.

21. A method for growing a serpentine superlattice on a substrate comprising the steps of:
  (i) creating a periodic array of adjacent steps on the surface of said substrate;
  (ii) depositing a first layer on said surface, said first layer having a plurality of first material regions, said plurality of first material regions having a coverage ratio of $m_1$, each of said first material regions located similarly to a respective step of said surface, said first layer having a plurality of second material regions, said plurality of second material regions having a coverage ratio of $n_1$, each of said second material regions located similarly to a respective step surface and located adjacent to a respective first material region, said first layer having a first layer coverage ratio of $p_1 = m_1 + n_1$;
  (iii) depositing a plurality of ith layers lying above said first layer, each of said ith layers located such that an ith layer is below an (i+1)th layer and above an (i−1)th layer, each of said ith layers having a plurality of first material regions, said plurality of first material regions for said ith layer having a coverage ratio of $m_i$, each of said first material regions for said ith sheet located similarly to a respective step of said surface, each of said ith layers having a plurality of second material regions, said plurality of second material regions for said ith sheet having a coverage ratio of $n_i$, each of said second material regions for said ith sheet located similarly to a respective step surface and located adjacent to a respective first material region, each of said ith layers having an ith layer coverage ratio of $p_i = m_i + n_i$,
  (iv) varying said layer coverage ratio with the index i of each layer such that for a first set of a plural number of contiguous layers, said first set of contiguous layers having either all coverage ratios $p_i$ less than 1.0 or all coverage ratios $p_i$ greater than 1.0, said layer coverage ratio $p_i$ monotonically changes with i.

22. The device as recited in claim 13 wherein said layer coverage ratio varies with the index i of each layer such that for a second set of a plural number of contiguous layers, said second set of contiguous layers including layers having a coverage ratio $p_i$ less than 1.0 and layers having a coverage ratio $p_i$ greater than 1.0, said layer coverage ratio $p_i$ monotonically changes with i from $p_i<1.0$ to $p_i>1.0$.

23. The device as recited in claim 22 wherein for a subset of contiguous layers above and below layer i=I, where said Ith layer coverage ratio $p_I=1.0$, said ith layer coverage ratio varies from $p_{i<I}<1.0$ to $p_{i>I}>1.0$.

24. The device as recited in claim 22 wherein for a subset of contiguous layers above and below layer i=I, where said Ith layer coverage ratio $p_I=1.0$, said ith layer coverage ratio varies from $p_{i<I}>1.0$ to $p_{i>I}<1.0$.

25. The method as recited in claim 21 wherein for a subset of contiguous layers above and below layer i=I, where said Ith layer coverage ratio $p_I=1.0$, said ith layer coverage ratio varies from $p_{i<I}=1.0$ to $p_{i>I}<1.0$.

26. The method as recited in claim 25 further comprising the step of varying said layer coverage ratio with the index i of each layer such that for a second set of a plural number of contiguous layers, said second set of contiguous layers including layers having a coverage ratio $p_i$ less than 1.0 and layers having a coverage ratio $p_i$ greater than 1.0, said layer coverage ratio $p_i$ monotonically changes with i from $p_i<1.0$ to $p_i>1.0$.

27. The method as recited in claim 26 wherein for a subset of contiguous layers above and below layer i=I, where said Ith layer coverage ratio $p_I=1.0$, said ith layer coverage ratio varies from $p_{i<I}<1.0$ to $p_{i>I}>1.0$.

* * * * *